US012265133B2

United States Patent
Goto et al.

(10) Patent No.: US 12,265,133 B2
(45) Date of Patent: Apr. 1, 2025

(54) METHOD FOR INSPECTING NONAQUEOUS ELECTROLYTE RECHARGEABLE BATTERY

(71) Applicants: PRIMEARTH EV ENERGY CO., LTD., Kosai (JP); TOYOTA JIDOSHA KABUSHIKI KAISHA, Toyota (JP); PRIME PLANET ENERGY & SOLUTIONS, INC., Tokyo (JP)

(72) Inventors: Shusaku Goto, Hamamatsu (JP); Hiroaki Ikeda, Tokyo (JP)

(73) Assignees: TOYOTA BATTERY CO., LTD., Kosai (JP); TOYOTA JIDOSHA KABUSHIKI KAISHA, Toyota (JP); PRIME PLANET ENERGY & SOLUTIONS, INC., Tokyo (JP)

( * ) Notice: Subject to any disclaimer, the term of this patent is extended or adjusted under 35 U.S.C. 154(b) by 245 days.

(21) Appl. No.: 18/072,563

(22) Filed: Nov. 30, 2022

(65) Prior Publication Data
US 2023/0176134 A1 Jun. 8, 2023

(30) Foreign Application Priority Data
Dec. 3, 2021 (JP) ................................. 2021-197140

(51) Int. Cl.
G01R 31/3835 (2019.01)
G01R 19/165 (2006.01)
(Continued)

(52) U.S. Cl.
CPC ... G01R 31/3835 (2019.01); G01R 19/16542 (2013.01); G01R 31/374 (2019.01);
(Continued)

(58) Field of Classification Search
CPC ............ G01R 19/16542; G01R 31/374; G01R 31/3835; G01R 31/385; G01R 31/3865
See application file for complete search history.

(56) References Cited

U.S. PATENT DOCUMENTS

2016/0261006 A1* 9/2016 Ueno ................ H01M 10/0569
2016/0291093 A1* 10/2016 Matsuyama ......... G01R 31/385
(Continued)

FOREIGN PATENT DOCUMENTS

JP 2009-004389 A 1/2009
JP 2012-084346 A 4/2012
(Continued)

OTHER PUBLICATIONS

JP Office Action dated Dec. 5, 2023 as received in Application No. 2021-197140.

*Primary Examiner* — Steven L Yeninas
(74) *Attorney, Agent, or Firm* — Maschoff Brennan (57) ABSTRACT

An inspecting step includes a first period after a cooling step ends and a second period after the first period ends. Variations in a voltage drop value per unit time in a nonaqueous electrolyte rechargeable battery are smaller in the second period than in the first period. The cooling step cools the battery in a state where the electrode body is directly or indirectly pressurized and restrained in a thickness direction with a smaller pressure than that in the inspecting step or in a state where the electrode body is not restrained. The voltage value of the battery is measured when a specified time has passed after the voltage value of the battery was measured in the second period. The battery is determined as being normal when the voltage drop value per unit time based on the measured voltage value is less than or equal to a threshold value.

4 Claims, 7 Drawing Sheets

(51) Int. Cl.
    *G01R 31/374*     (2019.01)
    *G01R 31/385*     (2019.01)
    *G01R 31/392*     (2019.01)

(52) U.S. Cl.
    CPC ........ *G01R 31/3865* (2019.01); *G01R 31/385* (2019.01); *G01R 31/392* (2019.01)

(56) References Cited

U.S. PATENT DOCUMENTS

| | | | |
|---|---|---|---|
| 2017/0030975 A1* | 2/2017 | Ueno | G01R 31/392 |
| 2020/0011894 A1* | 1/2020 | Hojo | G01R 31/50 |

FOREIGN PATENT DOCUMENTS

| | | |
|---|---|---|
| JP | 2012-221648 A | 11/2012 |
| JP | 2014-026732 A | 2/2014 |
| JP | 2015-219971 A | 12/2015 |
| JP | 2016-029616 A | 3/2016 |
| WO | 2015/173623 A1 | 11/2015 |

* cited by examiner

METHOD FOR INSPECTING NONAQUEOUS ELECTROLYTE RECHARGEABLE BATTERY

1. FIELD

The present disclosure relates to a method for inspecting a nonaqueous electrolyte rechargeable battery, and more specifically, a method for inspecting a nonaqueous electrolyte rechargeable battery capable of shortening an inspection time for a self-discharging inspection.

2. DESCRIPTION OF RELATED ART

In conventional nonaqueous electrolyte rechargeable batteries, self-discharging increases when an internal short circuit occurs. This creates a need for a self-discharging inspection for a nonaqueous electrolyte rechargeable battery. Japanese Laid-Open Patent Publication No. 2016-29616 discloses an example of a method for inspecting a nonaqueous electrolyte rechargeable battery. This method includes a first aging step, a first measuring step, a second aging step, a second measuring step, and a determining step. The first aging step stores, under a high-temperature environment, a rechargeable battery that has been initially charged. The first measuring step measures the voltage of the rechargeable battery under the high-temperature environment. The second aging step stores the rechargeable battery under room temperature environment. The second measuring step measures the voltage of the rechargeable battery under the room temperature environment. After the voltage difference measured in the first and second measuring steps is calculated as a voltage drop value, the determining step determines the rechargeable battery as being defective when the voltage drop value is greater than a threshold value.

However, the invention disclosed in Japanese Laid-Open Patent Publication No. 2016-29616 may have variations in the voltage drop value. In order to limit the variations in the voltage drop value, the second measuring step needs to be performed after the second aging step is performed for a relatively long period of time. As a result, a relatively long period of time is required for inspection.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A method for inspecting a nonaqueous electrolyte rechargeable battery according to an aspect of the present disclosure is provided. The nonaqueous electrolyte rechargeable battery includes an electrode body, a nonaqueous electrolyte, and a battery case accommodating the electrode body and the nonaqueous electrolyte. The method includes a high-temperature aging step of storing, under a high-temperature environment, the nonaqueous electrolyte rechargeable battery after being charged, a cooling step of cooling the nonaqueous electrolyte rechargeable battery stored under the high-temperature environment in the high-temperature aging step, and an inspecting step of inspecting, upon completion of the cooling step, whether the nonaqueous electrolyte rechargeable battery is normal based on a voltage drop value per unit time in the nonaqueous electrolyte rechargeable battery. The inspecting step includes a first period after the cooling step ends and a second period after the first period ends. Variations in the voltage drop value per unit time in the nonaqueous electrolyte rechargeable battery are smaller in the second period than in the first period. The inspecting step inspects whether the nonaqueous electrolyte rechargeable battery is normal in a state where the electrode body is directly or indirectly pressurized and restrained in a thickness direction. The cooling step cools the nonaqueous electrolyte rechargeable battery in a state where the electrode body is directly or indirectly pressurized and restrained in the thickness direction with a smaller pressure than a pressure in the inspecting step or in a state where the electrode body is not restrained. The inspecting step includes a first measuring step of measuring a voltage value of the nonaqueous electrolyte rechargeable battery in the second period, a second measuring step of measuring, in the second period, the voltage value of the nonaqueous electrolyte rechargeable battery when a specified time has passed after the first measuring step was performed, and a determining step of determining that the nonaqueous electrolyte rechargeable battery is normal when the voltage drop value per unit time based on the voltage value measured in the first measuring step and the voltage value measured in the second measuring step is less than or equal to a threshold value.

The inspecting step may include a third measuring step of measuring, in the second period, the voltage value of the nonaqueous electrolyte rechargeable battery when a time shorter than the specified time has passed after the first measuring step was performed and a first determining step of determining that the nonaqueous electrolyte rechargeable battery is normal when the voltage drop value per unit time based on the voltage value measured in the first measuring step and the voltage value measured in the third measuring step is less than or equal to the threshold value. The determining step may be a second determining step. The second measuring step and the second determining step may be performed when the first determining step determines that the nonaqueous electrolyte rechargeable battery is not normal.

The second measuring step and the second determining step does not have to be performed when the first determining step determines that the nonaqueous electrolyte rechargeable battery is normal.

The electrode body may include a positive electrode, a negative electrode, and a separator. The electrode body may be formed by laminating the positive electrode and the negative electrode with the separator disposed between the positive electrode and the negative electrode. In the inspecting step, the third measuring step and the first determining step may be performed when an opposing capacity ratio of the positive electrode to the negative electrode is within a predetermined allowable range.

The first measuring step and the second measuring step may be performed when a state of charge (SOC) of the nonaqueous electrolyte rechargeable battery is 80% to 90%.

A method for inspecting a nonaqueous electrolyte rechargeable battery according to another aspect of the present disclosure is provided. The nonaqueous electrolyte rechargeable battery includes an electrode body, a nonaqueous electrolyte, and a battery case accommodating the electrode body and the nonaqueous electrolyte. The method includes a high-temperature aging step of storing, under a high-temperature environment, the nonaqueous electrolyte rechargeable battery after being charged, a cooling step of cooling the nonaqueous electrolyte rechargeable battery stored under the high-temperature environment in the high-temperature aging step, and an inspecting step of inspecting, upon completion of the cooling step, whether the nonaqueous electrolyte rechargeable battery is normal based on a voltage drop value per unit time in the nonaqueous electrolyte rechargeable battery. The inspecting step includes a first period after the cooling step ends and a second period after the first period ends. Variations in the voltage drop value per unit time in the nonaqueous electrolyte rechargeable battery are smaller in the second period than in the first period. The inspecting step includes a first measuring step of measuring a voltage value of the nonaqueous electrolyte rechargeable battery in the second period, a third measuring step of measuring, in the second period, the voltage value of the nonaqueous electrolyte rechargeable battery when a time shorter than a specified time has passed after the first measuring step was performed, a first determining step of determining that the nonaqueous electrolyte rechargeable battery is normal when the voltage drop value per unit time based on the voltage value measured in the first measuring step and the voltage value measured in the third measuring step is less than or equal to a threshold value, a second measuring step of measuring, in a case where the first determining step determines that the nonaqueous electrolyte rechargeable battery is not normal, the voltage value of the nonaqueous electrolyte rechargeable battery when the specified time has passed after the first measuring step was performed, and a second determining step of determining that the nonaqueous electrolyte rechargeable battery is normal when the voltage drop value per unit time based on the voltage value measured in the first measuring step and the voltage value measured in the second measuring step is less than or equal to the threshold value.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

In this specification, "at least one of A and B" should be understood to mean "only A, only B, or both A and B."

First Embodiment

A method for inspecting a nonaqueous electrolyte rechargeable battery according to an embodiment will now be described.

Lithium-Ion Rechargeable Battery 10

The structure of a lithium-ion rechargeable battery 10 described in the present embodiment will now be briefly described.

Figure 1:
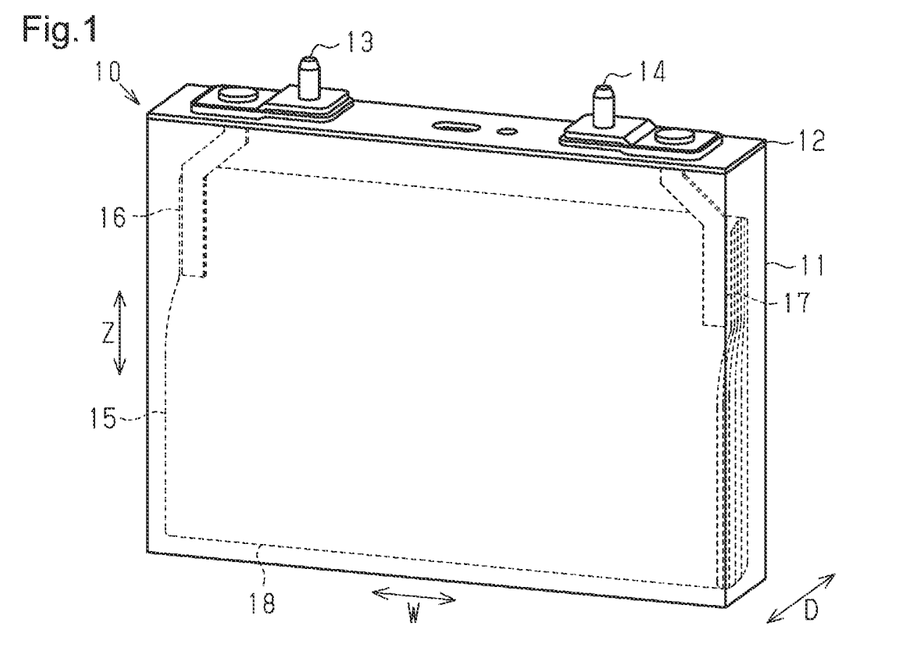
FIG. 1 is a perspective view of a lithium-ion rechargeable battery according to a first embodiment.

As shown in FIG. 1, the lithium-ion rechargeable battery 10 includes a cell battery. The lithium-ion rechargeable battery 10 includes a rectangular, box-shaped battery case 11 and a lid 12. The battery case 11 has an upper opening (not shown). The lid 12 is configured to seal the opening of the battery case 11. The battery case 11 and the lid 12 are formed from metal such as an aluminum alloy. The lid 12 includes a negative external terminal 13 and a positive external terminal 14 that are used to charge and discharge power. The negative external terminal 13 and the positive external terminal 14 may have any shape.

The lithium-ion rechargeable battery 10 includes an electrode body 15. The lithium-ion rechargeable battery 10 includes a negative current collector 16 and a positive current collector 17. The negative current collector 16 connects the negative electrode of the electrode body 15 to the negative external terminal 13. The positive current collector 17 connects the positive electrode of the electrode body 15 to the positive external terminal 14. The electrode body 15 is accommodated in the battery case 11. A nonaqueous electrolyte 18 is added into the battery case 11 from a liquid inlet (not shown). Thus, the lithium-ion rechargeable battery 10 includes the nonaqueous electrolyte 18. In the lithium-ion rechargeable battery 10, when the lid 12 is attached to the battery case 11, a hermetic battery container is formed. In this manner, the battery case 11 accommodates the electrode body 15 and the nonaqueous electrolyte 18.

Nonaqueous Electrolyte 18

The nonaqueous electrolyte 18 is a composition in which a nonaqueous solvent contains a supporting salt. In the present embodiment, ethylene carbonate (EC) may be used as the nonaqueous solvent. Alternatively, the nonaqueous solvent may be one or more materials selected from a group of propylene carbonate (PC), diethyl carbonate (DEC), dimethyl carbonate (DMC), ethyl methyl carbonate (EMC), and the like.

The supporting salt may be, for example, $LiPF_6$, $LiBF_4$, $LiClO_4$, $LiAsF_6$, $LiCF_3SO_3$, $LiC_4F_9SO_3$, $LiN(CF_3SO_2)_2$, $LiC(CF_3SO_2)_3$, or LiI. Moreover, the supporting salt may be one or more types of lithium compound (lithium salt) selected from the above compounds.

Electrode Body 15

Figure 2:
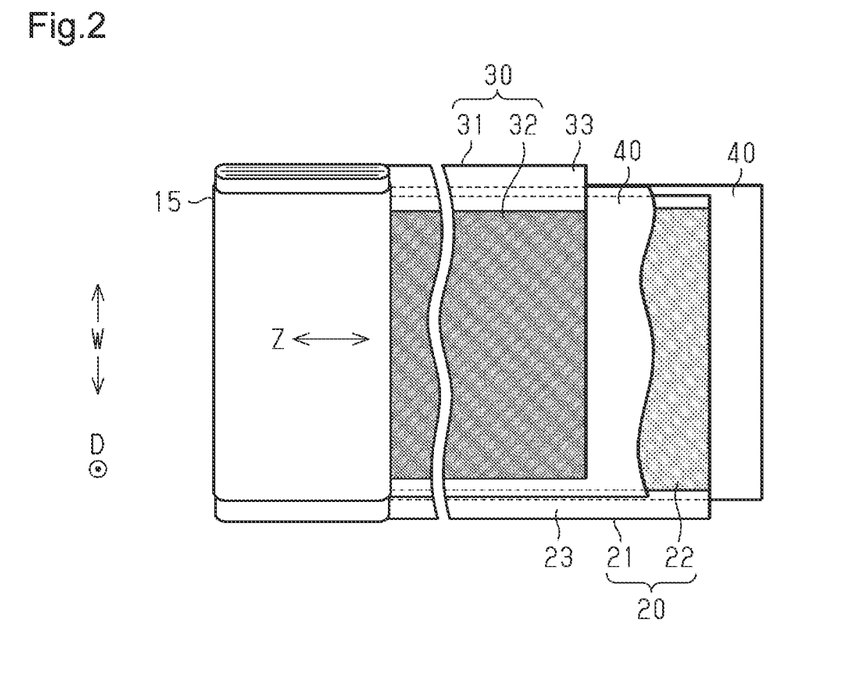
FIG. 2 is a schematic diagram showing the structure of the lamination of the electrode body in the lithium-ion rechargeable battery.

As shown in FIG. 2, the electrode body 15 includes a negative electrode sheet 20, a positive electrode sheet 30, and separators 40. The longitudinal direction of the electrode body 15 is referred to as a longitudinal direction Z. The thickness direction of the electrode body 15 is referred to as a thickness direction D. The direction orthogonal to the longitudinal direction Z and the thickness direction D of the electrode body 15 is referred to as a width direction W.

Negative Electrode Sheet 20

The negative electrode sheet 20 functions as an example of a negative electrode of the lithium-ion rechargeable battery 10. The negative electrode sheet 20 includes a negative base 21 and negative composite material layers 22. The negative composite material layers 22 are disposed on opposite sides of the negative base 21. The negative base 21 includes a negative connector 23 that is exposed from the electrode body 15. The negative connector 23 is disposed at one end of the electrode body 15 in the width direction W. In other words, the negative connector 23 is disposed at one end of the negative base 21 in the width direction W of the electrode body 15.

In the present embodiment, the negative base 21 is formed of a copper foil. The negative base 21 is a base as the aggregate for the negative composite material layers 22. The negative base 21 functions as a current collecting member that collects electricity from the negative composite material layers 22.

The negative composite material layers 22 include a negative active material. In the present embodiment, the negative active material is a material capable of storing and releasing lithium ions and is a powdered carbon material such as graphite. The negative electrode sheet 20 is formed by, for example, mixing the negative active material, solvent, and binder, applying the mixed negative composite material to the negative base 21, and drying the negative composite material.

Positive Electrode Sheet 30

The positive electrode sheet 30 functions as an example of a positive electrode of the lithium-ion rechargeable battery 10. The positive electrode sheet 30 includes a positive base 31 and positive composite material layers 32. The positive composite material layers 32 are disposed on opposite sides of the positive base 31. The positive base 31 includes a positive connector 33 that is exposed from the electrode body 15. The positive connector 33 is disposed at the other end of the electrode body 15 in the width direction W. In other words, the positive connector 33 is disposed at an end of the positive base 31 opposite the negative connector 23 in the width direction W of the electrode body 15.

In the present embodiment, the positive base 31 is formed of an aluminum foil or an aluminum-alloy foil. The positive base 31 is a base as the aggregate for the positive composite material layers 32. The positive base 31 functions as a current collecting member that collects electricity from the positive composite material layers 32.

The positive composite material layers 32 include a positive active material. The positive active material is a material capable of storing and releasing lithium and is, for example, lithium cobalt oxide ($LiCoO_2$), lithium manganese oxide ($LiMn_2O_4$), or lithium nickel oxide ($LiNiO_2$). Further, $LiCoO_2$, $LiMn_2O_4$, and $LiNiO_2$ may be mixed in any proportion. The positive composite material layers 32 include a conductive material. Examples of the conductive material include acetylene black (AB), carbon black such as Ketjenblack®, and graphite. The positive electrode sheet 30 is formed by, for example, mixing the positive active material, the conductive material, solvent, and binder, applying the mixed positive composite material to the positive base 31, and drying the positive composite material.

Separator 40

Each separator 40 retains the nonaqueous electrolyte 18 between the negative electrode sheet 20 and the positive electrode sheet 30. The separator 40 is a non-woven cloth of polypropylene or the like. For the separator 40, a porous polymer film (e.g., a porous polyethylene film, a porous polyolefin film, or a porous polyvinyl chloride film) and a lithium-ion-conductive or ion-conductive polymer electrolyte membrane may be used alone or combined. When the electrode body 15 is immersed into the nonaqueous electrolyte 18, the nonaqueous electrolyte 18 permeates the separator 40 from the ends toward the center.

Steps for Manufacturing Lithium-Ion Rechargeable Battery 10

The overview of the steps for manufacturing the lithium-ion rechargeable battery 10 of the present embodiment will now be described.

In the present embodiment, a sourcing step is performed. The sourcing step produces battery elements of the lithium-ion rechargeable battery 10. More specifically, the sourcing step forms each of the negative electrode sheet 20 and the positive electrode sheet 30, which are included in the battery elements of the lithium-ion rechargeable battery 10.

Upon completion of the sourcing step, a laminating step is performed. In the laminating step, the negative electrode sheet 20, the positive electrode sheet 30, and the separators 40 are laminated in the order of the negative electrode sheet 20, the separator 40, the positive electrode sheet 30, and the separator 40. That is, the electrode body 15 is formed by laminating the negative electrode sheet 20 and the positive electrode sheet 30 with the separator 40 disposed between the negative electrode sheet 20 and the positive electrode sheet 30. The negative composite material layers 22 and the positive composite material layers 32 are disposed to be opposed to each other at opposite sides of the separator 40. The negative electrode sheet 20 and the separator 40 are arranged such that the negative connector 23 is disposed to project from the separator 40 at one end of the electrode body 15 in the width direction W. The positive electrode sheet 30 and the separator 40 are arranged such that the positive connector 33 is disposed to project from the separator 40 at the other end in the width direction W of the electrode body 15. That is, in the electrode body 15, the negative base 21 is exposed from one end to form the negative connector 23, and the positive base 31 is exposed from the other end to form the positive connector 33.

Upon completion of the laminating step, the rolling step is performed. In the rolling step, the electrode body 15 is supported and rolled about a roll axis that extends in the width direction W. The rolled electrode body 15 includes a flat portion, which is shaped like an athletic track, and bent portions disposed at opposite ends of the flat portion.

Upon completion of the rolling step, a rolled body pressing step is performed. The electrode body 15 is pressed and compressed in the thickness direction D with a force that does not exceed a predetermined pressure. In the present embodiment, the predetermined pressure is 100 kN but is not limited thereto.

Figure 3:
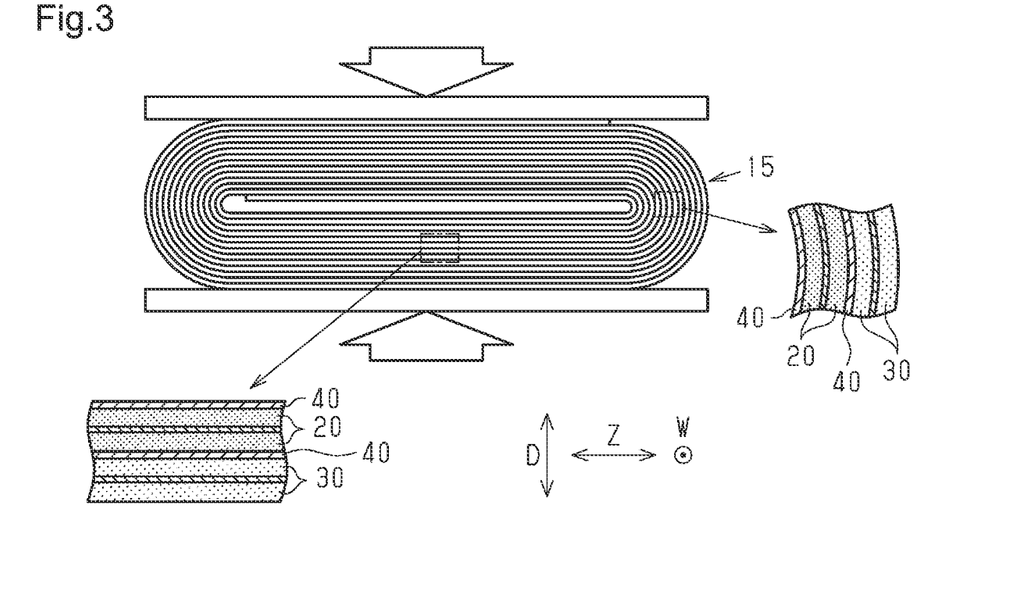
FIG. 3 is a schematic view showing the structure of an end of the electrode body viewed in the width direction W.

More specifically, as shown in FIG. 3, the electrode body 15 is supported and rolled about the roll axis in the longitudinal direction Z, in a state where the negative electrode sheet 20 and the positive electrode sheet 30 are overlapped and laminated with the separator 40 disposed therebetween. Pressure is applied to the electrode body 15 in the thickness direction D, which is orthogonal to the width direction W. As a result, as viewed in the width direction W, the end of the electrode body 15 has a low-profile shape like an athletic track.

Upon completion of the rolled body pressing step, a terminal welding step is performed. In the terminal welding step, the negative connector 23 is welded to the negative current collector 16 and electrically and mechanically connected to the negative current collector 16. Further, the positive connector 33 is welded to the positive current collector 17 and electrically and mechanically connected to the positive current collector 17.

Upon completion of the terminal welding step, a case inserting step is performed. In the case inserting step, the electrode body 15, which has been rolled and has a low profile, and the negative current collector 16 and the positive current collector 17, which are connected to the electrode body 15, are inserted into the battery case 11.

Upon completion of the case inserting step, a case welding step is performed. In the case welding step, the battery case 11 is sealed with the lid 12 through laser beam welding or the like. At this stage, the nonaqueous electrolyte 18 is not added, and the liquid inlet of the lid 12 is open.

Upon completion of the case welding step, a cell drying step is performed. In the cell drying step, for moisture and the like remaining in the battery case to be sufficiently dried, the temperature in the battery is heated to, for example, approximately 105° C.

Upon completion of the cell drying step, a step of liquid addition and sealing is performed. In the step of the liquid addition and sealing, the nonaqueous electrolyte 18 is added from the liquid inlet into the battery container. When the liquid addition is completed, the liquid inlet is sealed. This completes the assembling of the lithium-ion rechargeable battery 10. Then, as described below, a self-discharging inspection is performed.

Inspection Configuration of Lithium-Ion Rechargeable Battery 10

The configuration of inspecting the lithium-ion rechargeable battery 10 will now be described with reference to FIG. 4.

Figure 4:
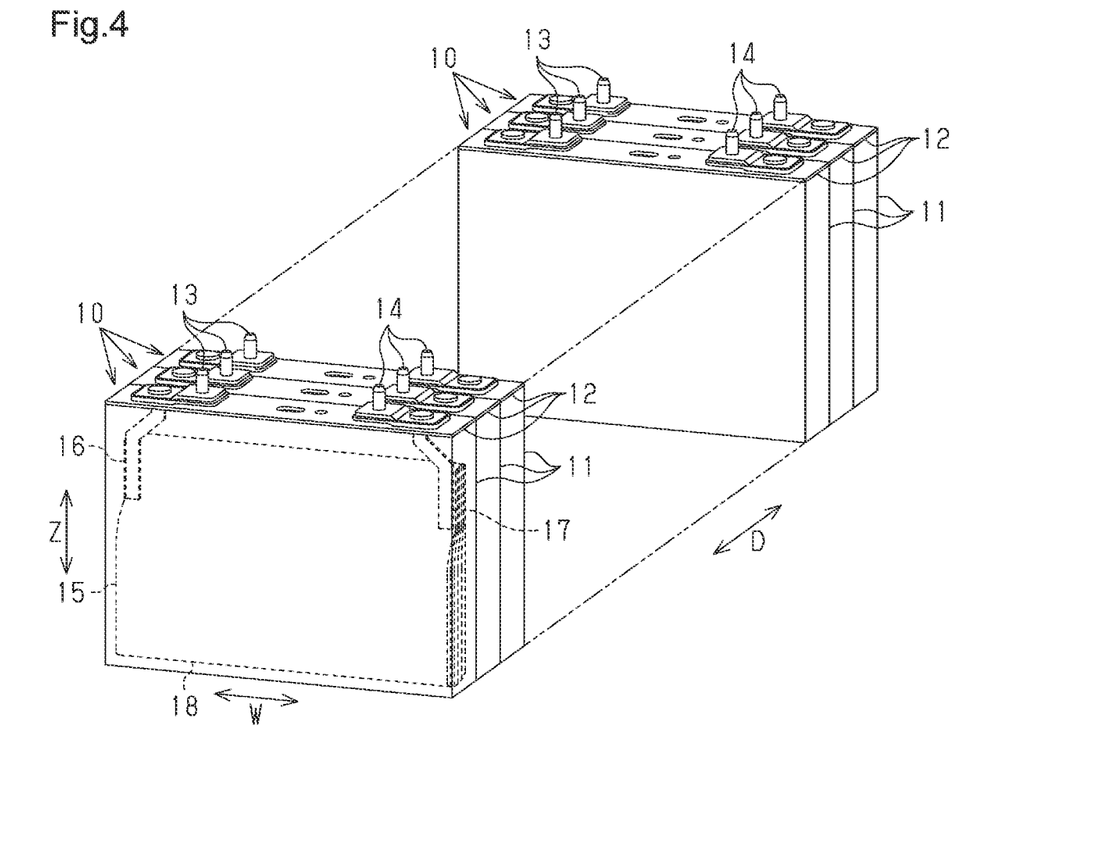
FIG. 4 is a perspective view showing an inspection configuration of the lithium-ion rechargeable battery of the present embodiment.

As shown in FIG. 4, when the self-discharging inspection is performed for the lithium-ion rechargeable battery 10, multiple lithium-ion rechargeable batteries 10 are installed in an inspection jig (not shown) to be arranged in the thickness direction D. While twenty-five lithium-ion rechargeable batteries 10 can be installed in the inspection jig in the present embodiment, the number of lithium-ion rechargeable batteries 10 may be changed. In the present embodiment, multiple lithium-ion rechargeable batteries 10 may be arranged such that a groove-shaped gap is formed between adjacent ones of the lithium-ion rechargeable batteries 10.

In some types of the steps, the lithium-ion rechargeable batteries 10 are restrained in the thickness direction D. The term "restrain" means directly or indirectly pressurizing the electrode body 15 in the thickness direction D to compress the separator 40. In the present embodiment, the battery case 11 is pressed in the thickness direction D with multiple lithium-ion rechargeable batteries 10 installed. The pressing does not have to be performed using a press machine and may be performed by fastening with a screw using a restraint frame. Restraint includes a strong restraint, in which a relatively strong pressure is applied, and a weak restraint, in which a weaker pressure than that of the strong restraint is applied. In the present embodiment, the weak restraint is performed at about 0.5 kN, but is not limited thereto. In the present embodiment, the strong restraint is performed at about the 10 kN, but is not limited thereto.

Multiple lithium-ion rechargeable batteries 10 are cooled by applying cold air thereto in a cooling step, which will be described in detail later. In the present embodiment, the cold air is applied to the lithium-ion rechargeable batteries 10 from below, but is not limited thereto. Cooling of the lithium-ion rechargeable batteries 10 is promoted by the cold air passing through the gaps, each formed between adjacent ones of the lithium-ion rechargeable batteries 10.

Method for Inspecting Lithium-Ion Rechargeable Battery 10

The method for inspecting the lithium-ion rechargeable battery 10 will now be described with reference to FIG. 5.

Figure 5:
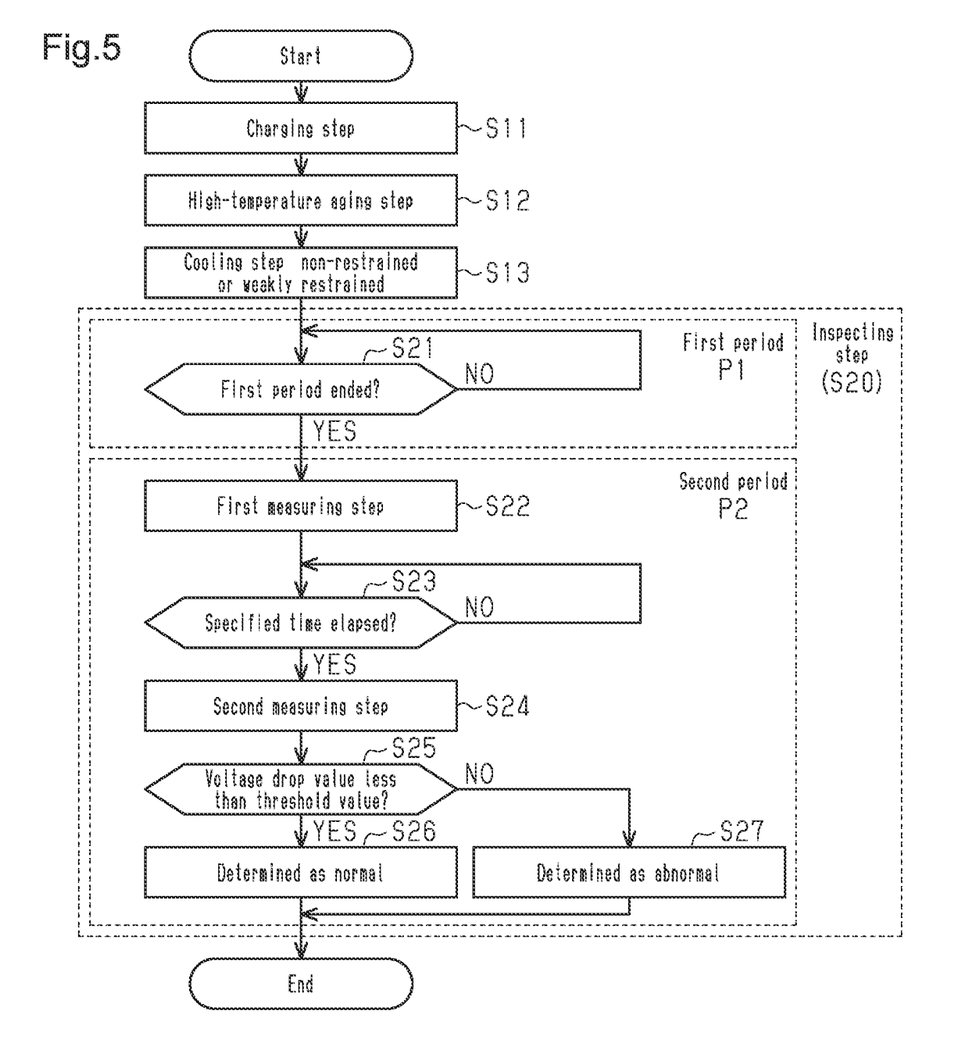
FIG. 5 is a flowchart illustrating a method for inspecting the lithium-ion rechargeable battery according to the first embodiment.

Referring to FIG. 5, when the manufacturing of the lithium-ion rechargeable battery 10 is completed, a charging step is first performed in step S11. In the charging step, initial charging is performed in order to, for example, form a solid electrolyte interphase (SEI) coating. The initial charging is performed at a relatively low charging rate to limit an increase in the temperature of the lithium-ion rechargeable battery 10. The charging process is performed to fully charge the battery such that the state of charge (SOC) becomes 100%. Instead, the SOC may be, for example, 90%. In the present embodiment, the charging step is performed at room temperature (e.g., about 20° C.). In the charging step, multiple lithium-ion rechargeable batteries 10 are strongly restrained.

Upon completion of the charging step, a high-temperature aging step is performed in step S12. In the high-temperature aging step, the lithium-ion rechargeable battery 10 charged in the charging step is stored under a high-temperature environment. In the high-temperature aging step, the lithium-ion rechargeable battery 10 is chemically stabilized and activated. One of the purposes of this step is as follows. When a micro-short circuit between electrodes is caused by a fine metal present in the electrodes, the temperature is raised to accelerate dissolution and deposition of the metal to detect the micro-short circuit. Thus, in the present embodiment, the high-temperature aging step is performed with the temperature kept at a relatively high temperature of, for example, about 60° C. In the present embodiment, in the high-temperature aging step, multiple lithium-ion rechargeable batteries 10 are stored under the high-temperature environment for a predetermined period of time. In the present embodiment, the high-temperature aging step is performed for, for example, forty-eight hours, but is not limited thereto. In the present embodiment, in the high-temperature aging step, the lithium-ion rechargeable batteries 10 are not restrained. Instead, the lithium-ion rechargeable batteries 10 may be weakly restrained.

Upon completion of the high-temperature aging step, the cooling step is performed in step S13. The cooling step cools the lithium-ion rechargeable battery 10 stored under the high-temperature environment in step S12. In the cooling step, to prevent the lithium-ion rechargeable batteries 10 from being exposed to a high temperature state more than necessary, cold air is applied to multiple lithium-ion rechargeable batteries 10 for a predetermined period of time to cool the lithium-ion rechargeable batteries 10 and return their temperatures to room temperature. This shortens the inspection time of the self-discharging inspection. The cooling step is performed at room temperature (e.g., about 20° C.). In the present embodiment, the cooling step is performed for, for example, four hours, but is not limited thereto. In the present embodiment, in the cooling step, the lithium-ion rechargeable batteries 10 are not restrained. Instead, the lithium-ion rechargeable batteries 10 may be weakly restrained. Thus, the cooling step cools the lithium-ion rechargeable batteries 10 in a state where the electrode body 15 is directly or indirectly pressurized and restrained in the thickness direction D with a smaller pressure than a pressure in an inspecting step, which will be described later, or in a state where the electrode body 15 is not restrained.

Upon completion of the cooling step, the inspecting step is performed in step S20. After the charging step, the high-temperature aging step, and the cooling step are performed, the inspecting step is performed to measure open-circuit voltages OCV of multiple lithium-ion rechargeable batteries 10. As a result, the inspecting step inspects whether excessive self-discharging has occurred due to a voltage drop value $\Delta V$ per unit time of each open-circuit voltage OCV. That is, the inspecting step inspects, upon completion of the cooling step, whether the lithium-ion rechargeable battery 10 is normal based on the voltage drop value $\Delta V$ per unit time in the lithium-ion rechargeable battery 10. The inspecting step is performed at room temperature (e.g., about 20° C.). In the inspecting step, multiple lithium-ion rechargeable batteries 10 are strongly restrained in order to find a micro-short circuit between electrodes. Thus, the inspecting step inspects whether each lithium-ion rechargeable battery 10 is normal in a state where the electrode body 15 is directly or indirectly pressurized and restrained with a larger pressure than the pressure in the cooling step in the thickness direction D.

Figure 6:
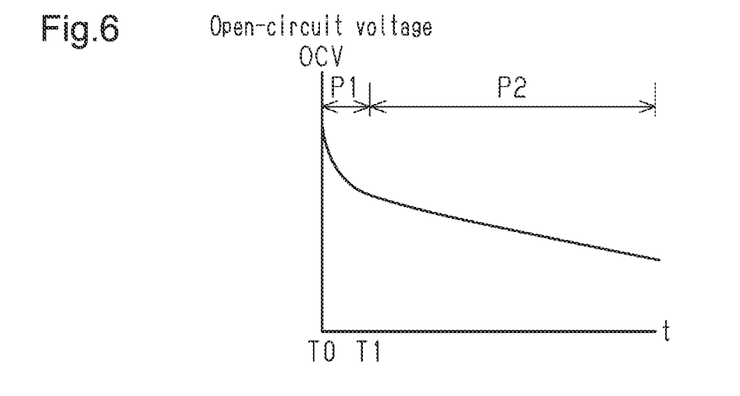
FIG. 6 is a graph showing the open-circuit voltage of the lithium-ion rechargeable battery of the first embodiment.
Figure 7:
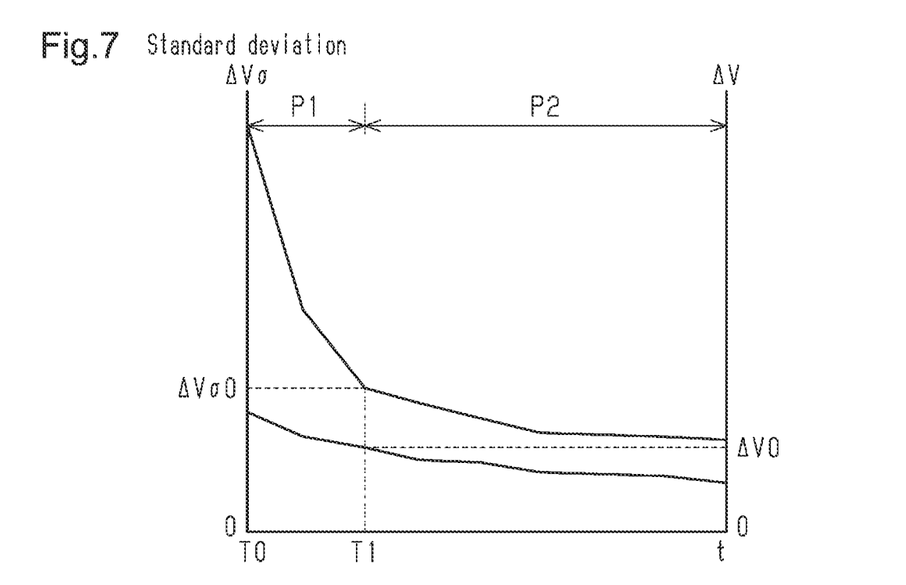
FIG. 7 is a graph showing the voltage drop value per unit time in the open-circuit voltage and variations in the open-circuit voltage in the lithium-ion rechargeable battery of the first embodiment.

As shown in FIGS. 6 and 7, the inspecting step includes a first period P1 and a second period P2. The first period P1 ranges from T0 to T1. The first period P1 is a period after the cooling step ends. The second period P2 is subsequent to T1. The second period P2 is a period after the first period P1 ends. In the present embodiment, the first period P1 is, for example, one to two hours, but is not limited thereto.

Inspecting Step

As shown in FIG. 5, when the inspecting step is started, it is determined in step S21 whether the first period P1 has ended. The process does not proceed to step S22 until the first period P1 ends. When the first period P1 ends, the process proceeds to step S22. That is, the inspecting step does not measure the open-circuit voltage OCV of a cell battery in the first period P1.

In the inspecting step, when the first period P1 ends, the second period P2 starts. In step S22, the first measuring step is performed to measure a first open-circuit voltage OCV1. Thus, the inspecting step includes the first measuring step, which measures a voltage value of the lithium-ion rechargeable battery 10 in the second period P2.

Upon completion of the first measuring step, it is determined in step S23 whether a specified time has elapsed after the first measuring step ended. In the present embodiment, the specified time is, for example, twenty-four hours, but is not limited thereto. In the second period P2, the process does not proceed to step S24 until the specified time has elapsed after the first measuring step ended, and the process proceeds to step S24 when the specified time has elapsed after the first measuring step ended.

When the specified time has elapsed after the first measuring step ended, a second measuring step is performed in step S24 to measure a second open-circuit voltage OCV2. Thus, the inspecting step includes the second measuring step, which measures, in the second period P2, the voltage value of the lithium-ion rechargeable battery 10 when the specified time has elapsed after the first measuring step was performed.

Upon completion of the second measuring step, the voltage drop value $\Delta V$ per unit time is calculated in step S25 based on the difference between the first open-circuit voltage OCV1 and the second open-circuit voltage OCV2 and based on the specified time. In this step, it is determined whether the calculated voltage drop value $\Delta V$ per unit time is less than or equal to a threshold value.

When the voltage drop value $\Delta V$ per unit time is determined as being less than or equal to the threshold value, the lithium-ion rechargeable battery 10 is determined as being normal in step S26. When it is determined that the voltage drop value $\Delta V$ per unit time is not less than or equal to the threshold value, the lithium-ion rechargeable battery 10 is determined as being abnormal in step S27. That is, the inspecting step includes a determining step (second determining step) of determining that the lithium-ion rechargeable battery 10 is normal when the voltage drop value $\Delta V$ per unit time based on the voltage measured in the first measuring step and the voltage measured in the second measuring step is less than or equal to the threshold value.

State in Each Period of Inspecting Step

The state in each period of the inspecting step will now be described with reference to FIGS. 6 and 7.

As shown in FIGS. 6 and 7, the voltage drop value $\Delta V$ per unit time of the open-circuit voltage OCV decreases as time elapses after the end of the cooling step. In other words, the open-circuit voltage OCV drops more rapidly in the first period P1 than in the second period P2, and the open-circuit voltage OCV drops more gently in the second period P2 than in the first period P1.

For example, as shown in FIG. 7, the voltage drop value $\Delta V$ per unit time is a reference voltage drop value $\Delta V0$ at T1, at which the first period P1 ends. Prior to T1, the voltage drop value $\Delta V$ per unit time is greater than the reference voltage drop value $\Delta V0$. Subsequent to T1, the voltage drop value $\Delta V$ per unit time is smaller than the reference voltage drop value $\Delta V0$. That is, the second period P2 has a smaller voltage drop value $\Delta V$ per unit time of the open-circuit voltage OCV than the first period P1. In this case, unlike the second determining step, the voltage drop value $\Delta V$ per unit time of the open-circuit voltage OCV is calculated as a voltage drop value in a time shorter than the specified time. However, this configuration does not have to be employed.

In addition, as time elapses after the end of the cooling step, a decrease occurs in a standard deviation $\Delta V\sigma$ of the voltage drop value $\Delta V$ per unit time of the open-circuit voltage OCV in the lithium-ion rechargeable batteries 10.

For example, the standard deviation $\Delta V\sigma$ of the voltage drop value $\Delta V$ per unit time is a reference standard deviation $\Delta V\sigma 0$ at T1, at which the first period P1 ends. The reference standard deviation $\Delta V\sigma 0$ is a permitted standard deviation to determine the voltage drop value $\Delta V$ per unit time. Prior to T1, the standard deviation $\Delta V\sigma$ of the voltage drop value $\Delta V$ per unit time is greater than the reference standard deviation $\Delta V\sigma°$. Subsequent to T1, the standard deviation $\Delta V\sigma$ of the voltage drop value $\Delta V$ per unit time is smaller than the reference standard deviation $\Delta V\sigma°$. That is, the second period P2 has smaller variations than the first period P1 in the voltage drop value $\Delta V$ per unit time in the lithium-ion rechargeable battery 10. In other words, the second period P2 has a smaller inclination than the first period P1 in the voltage drop of the lithium-ion rechargeable battery 10.

It has been found that this is because the temperature of the lithium-ion rechargeable battery 10 has not reached room temperature from a relatively high temperature after the high-temperature aging step and the cooling step. For example, in the high-temperature aging step, multiple lithium-ion rechargeable batteries 10 are stored under a high-temperature environment.

Subsequently, the lithium-ion rechargeable batteries 10 are disposed under room temperature environment. Temperatures are different between external air and the lithium-ion rechargeable batteries 10. Further, the arrangement of each of the lithium-ion rechargeable batteries 10 is different. Thus, each lithium-ion rechargeable battery 10 has a different circumstance in which the heat in the lithium-ion rechargeable batteries 10 is transferred to external air. As a result, variations occur in the temperatures of the lithium-ion rechargeable batteries 10.

In particular, in the cooling step, cold air is applied to the lithium-ion rechargeable batteries 10 to cool the lithium-ion rechargeable batteries 10. Since the arrangement of each of the lithium-ion rechargeable batteries 10 is different, a different amount of cold air strikes each lithium-ion rechargeable battery 10. As a result, variations occur in the temperatures of the lithium-ion rechargeable batteries 10.

For example, the outermost one of the lithium-ion rechargeable batteries 10 arranged in the thickness direction D and inner ones of the lithium-ion rechargeable batteries 10 each have a different circumstance in which the heat in the lithium-ion rechargeable battery 10 is transferred to external air, and each have a different amount of cold air.

When the temperature in a lithium-ion rechargeable battery 10 is relatively high, the voltage drop value $\Delta V$ of the open-circuit voltage OCV tends to be larger than when the temperature is relatively low. Thus, when variations occur in the temperatures of multiple lithium-ion rechargeable batteries 10, variations also occur in the voltage drop value $\Delta V$ of the open-circuit voltage OCV. Accordingly, the variations in the open-circuit voltage OCV in the lithium-ion rechargeable batteries 10 are limited by measuring the first open-circuit voltage OCV1 in the second period P2 without measuring the first open-circuit voltage OCV1 in the first period P1.

Restraint Intensity in Cooling Step

The restraint intensity in the cooling step will now be described with reference to FIG. 8.

Figure 8:
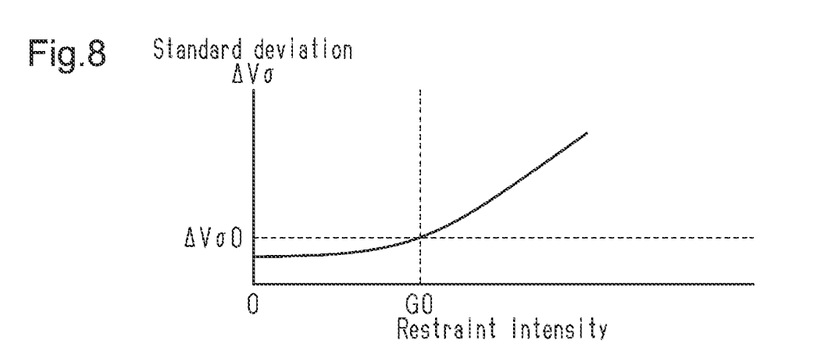
FIG. 8 is a graph showing the intensity of restraint during the cooling step and variations in the open-circuit voltage in the lithium-ion rechargeable battery of the first embodiment.

As shown in FIG. 8, as the restraint intensity in the cooling step decreases, a decrease occurs in the standard deviation $\Delta V\sigma$ of the voltage drop value $\Delta V$ per unit time of the open-circuit voltage OCV in the lithium-ion rechargeable batteries 10.

For example, the standard deviation $\Delta V\sigma$ of the voltage drop value $\Delta V$ per unit time is the reference standard deviation $\Delta V\sigma 0$ when the restraint intensity in the cooling step is a reference intensity GO. When the restraint intensity is greater than the reference intensity GO, the standard deviation $\Delta V\sigma$ of the voltage drop value $\Delta V$ per unit time is greater than the reference standard deviation $\Delta V\sigma 0$. When the restraint intensity is smaller than the reference intensity GO, the standard deviation $\Delta V\sigma$ of the voltage drop value $\Delta V$ per unit time is smaller than the reference standard deviation $\Delta V\sigma 0$. The reference intensity GO is smaller than the restraint intensity of strong restraint and greater than the restraint intensity of weak restraint.

Upon completion of the high-temperature aging step, when multiple lithium-ion rechargeable batteries 10 are cooled in the cooling step, the temperature of each lithium-ion rechargeable battery 10 reaches room temperature from a relatively high temperature less likely in the strong restraint intensity than in the weak small intensity. Accordingly, in the cooling step, the variations in the open-circuit voltage OCV in the lithium-ion rechargeable batteries 10 are limited by a configuration in which the lithium-ion rechargeable batteries 10 are not restrained or by weakly restraining the lithium-ion rechargeable batteries 10.

Operation of First Embodiment

The operation of the first embodiment will now be described.

First, when the manufacturing of the lithium-ion rechargeable battery 10 is completed, initial charging is performed on the lithium-ion rechargeable battery 10 in the charging step. Then, in the high-temperature aging step, the lithium-ion rechargeable batteries 10 are stored under a high-temperature environment. Thus, an initial charging capacity and high-temperature aging conditions are designated as the conditions for inspecting the lithium-ion rechargeable battery 10.

Next, the cooling step is performed to cool the lithium-ion rechargeable battery 10. In the cooling step, multiple lithium-ion rechargeable batteries 10 are weakly restrained or are not restrained. This limits the variations in the temperatures of the lithium-ion rechargeable batteries 10.

Subsequently, in the inspecting step, the first open-circuit voltage OCV1 is not measured in the first period P1. When the first period P1 ends, the first open-circuit voltage OCV1 is measured in the second period P2. In the second period P2, when the specified time has elapsed after the first open-circuit voltage OCV1 was measured, the second open-circuit voltage OCV2 is measured. The voltage drop value $\Delta V$ per unit time of the open-circuit voltage OCV is calculated based on the first open-circuit voltage OCV1, the second open-circuit voltage OCV2, and the specified time. When the calculated voltage drop value $\Delta V$ per unit time of the open-circuit voltage OCV is determined as being less than or equal to the threshold value, a self-discharging inspection determines that each lithium-ion rechargeable battery 10 is normal.

In such a manner, the variations in the voltage drop value $\Delta V$ per unit time in the lithium-ion rechargeable batteries 10 are limited by measuring the first open-circuit voltage OCV1 in the second period P2 without measuring the first open-circuit voltage OCV1 in the first period P1. In addition, the specified time from the measurement of the first open-circuit voltage OCV1 to the measurement of the second open-circuit voltage OCV2 is shortened. As a result, the inspection time of the self-discharging inspection is shortened.

Advantages of First Embodiment

The advantages of the first embodiment will now be described.

(1) In the method for inspecting the lithium-ion rechargeable battery 10 of the present embodiment, the first open-circuit voltage OCV1 of the lithium-ion rechargeable battery 10 is measured in the second period P2. Then, the second open-circuit voltage OCV2 is measured when the specified time has elapsed after the first open-circuit voltage OCV1 was measured. The second period P2 has smaller variations than the first period P1 in the voltage drop value $\Delta V$ per unit time in multiple lithium-ion rechargeable batteries 10. As a result, the time from the end of the cooling step to the measurement of the second open-circuit voltage OCV2 is shortened by measuring the first open-circuit voltage OCV1 in the second period P2 rather than by measuring the first open-circuit voltage OCV1 in the first period P1. Hence, the variations in the voltage drop value $\Delta V$ per unit time in the lithium-ion rechargeable batteries 10 are limited. Further, the inspection time of the self-discharging inspection is shortened without a decrease in the inspection accuracy of the self-discharging inspection.

(2) The cooling step cools the lithium-ion rechargeable batteries 10 in the state where the electrode body 15 is directly or indirectly pressurized and restrained with a relatively small pressure in the thickness direction D or in a state where the electrode body 15 is not restrained. This improves the efficiency of cooling the lithium-ion rechargeable batteries 10 and limits the variations in the temperatures of the lithium-ion rechargeable batteries 10. Hence, the variations in the voltage drop value $\Delta V$ per unit time in the lithium-ion rechargeable batteries 10 are limited. Further, the inspection time of the self-discharging inspection is shortened without a decrease in the inspection accuracy of the self-discharging inspection.

Second Embodiment

The second embodiment will now be described.

In the first embodiment, the first open-circuit voltage OCV1 and the second open-circuit voltage OCV2, which is obtained after the specified time has elapsed, are used to determine whether the lithium-ion rechargeable battery 10 is normal. In the second embodiment, the first open-circuit voltage OCV1 and a third open-circuit voltage OCV3 that is obtained after a time that is shorter than the specified time has elapsed are used to determine whether the lithium-ion rechargeable battery 10 is normal. In the following description, the same reference numerals are given to the same configurations and the same control contents as denoted by the same reference numerals, and redundant description thereof will be omitted or simplified.

Figure 9:
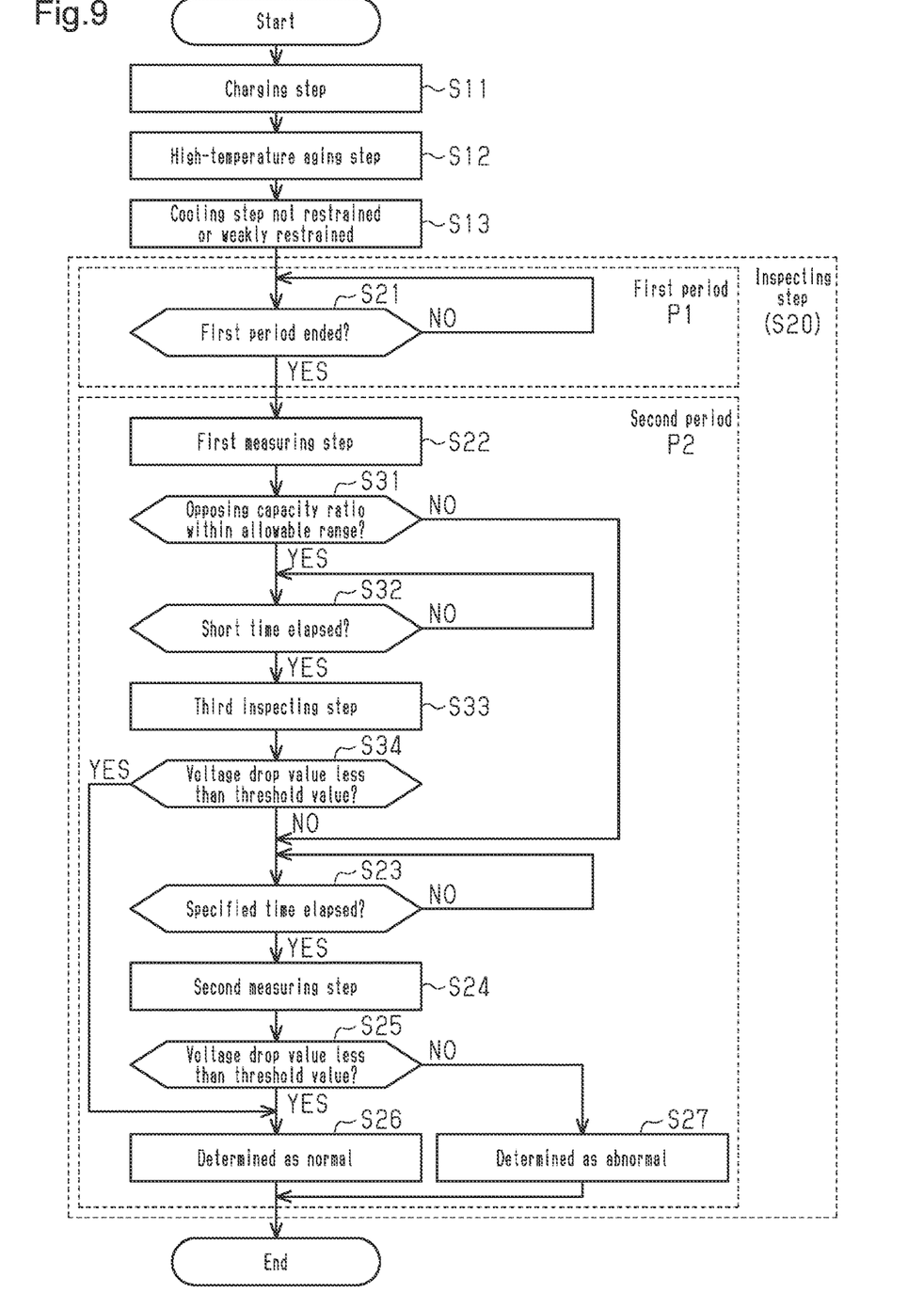
FIG. 9 is a flowchart illustrating a method for inspecting the lithium-ion rechargeable battery according to a second embodiment.

As shown in FIG. 9, upon completion of the first measuring step, it is determined in step S31 whether an opposing capacity ratio is within an allowable range. The opposing capacity ratio refers to the ratio of a positive electrode capacity to a negative electrode capacity in a portion where the negative electrode sheet 20 opposes the positive electrode sheet 30.

The positive electrode capacity may be calculated based on, for example, a manufacturing condition and an inspecting condition of the lithium-ion rechargeable battery 10. Examples of the manufacturing condition of the lithium-ion rechargeable battery 10 include an electrode condition of the lithium-ion rechargeable battery 10. Examples of the electrode condition of the lithium-ion rechargeable battery 10 include the material properties of the positive electrode and the weight per unit area of the positive electrode. The material properties of the positive electrode are those of the positive base 31 and the positive composite material layer 32. The weight per unit area of the positive electrode is the weight per unit area of the positive composite material layer 32 relative to the positive base 31. The inspecting condition of the lithium-ion rechargeable battery 10 can be estimated based on, for example, an initial charging capacity. The initial charging capacity refers to the amount of initial charging performed in the charging step of step S11.

The negative electrode capacity may be calculated based on, for example, the manufacturing condition of the lithium-ion rechargeable battery 10. Examples of the manufacturing condition of the lithium-ion rechargeable battery 10 include an electrode condition of the lithium-ion rechargeable battery 10. Examples of the electrode condition of the lithium-ion rechargeable battery 10 include the weight per unit area of the negative electrode. The weight per unit area of the negative electrode is the weight per unit area of the negative composite material layer 22 relative to the negative base 21.

Such manufacturing condition and inspecting condition of the lithium-ion rechargeable battery 10 may be a measured value of a lithium-ion rechargeable battery 10 subject to inspection or may be a specified value of a lithium-ion rechargeable battery 10 when the battery is designed.

The allowable range is calculated based on a reference opposing capacity ratio R0 that is a reference related to the opposing capacity ratio. Specifically, the allowable range is a predetermined tolerance range of the reference opposing capacity ratio R0. In particular, the allowable range is used to determine that the lithium-ion rechargeable battery 10 is normal depending on whether the voltage drop value $\Delta V$ per unit time in a short time that is shorter than the specified time is less than or equal to a threshold value.

When determining that the opposing capacity ratio is not within the allowable range, the process proceeds to step S23. When determining that the opposing capacity ratio is within the allowable range, the process proceeds to step S32.

When the opposing capacity ratio is determined as being within the allowable range, it is determined in step S32 whether a predetermined short time has elapsed since completion of the first measuring step. The short time is shorter than the specified time and may be, for example, about ten minutes. In the second period P2, the process does not proceed to step S33 until the short time has elapsed since the completion of the first measuring step, and the process proceeds to step S33 when the short time has elapsed since the completion of the first measuring step.

After the short time elapses upon completion of the first measuring step, a third measuring step is performed in step S33 to measure a third open-circuit voltage OCV3. Thus, the inspecting step includes the third measuring step, which measures, in the second period P2, the voltage value of the lithium-ion rechargeable battery 10 when the time that is shorter than the specified time has passed after the first measuring step was performed.

Upon completion of the third measuring step, the voltage drop value $\Delta V$ per unit time is calculated in step S34 based on the difference between the first open-circuit voltage OCV1 and the third open-circuit voltage OCV3 and based on the short time. It is determined whether the calculated voltage drop value $\Delta V$ per unit time is less than or equal to the threshold value.

When the voltage drop value $\Delta V$ per unit time is determined as being less than or equal to the threshold value, it is determined in step S26 that the lithium-ion rechargeable battery 10 is normal. When it is determined that the voltage drop value $\Delta V$ per unit time is not less than or equal to the threshold value, the process proceeds to step S23. That is, the inspecting step includes a determining step of determining that the lithium-ion rechargeable battery 10 is normal when the voltage drop value ΔV per unit time based on the voltage measured in the first measuring step and the voltage measured in the third measuring step is less than or equal to the threshold value.

Thus, in the present embodiment, the determining step of determining the voltage drop value ΔV per unit time based on the first open-circuit voltage OCV1 and the third open-circuit voltage OCV3 corresponds to an example of the first determining step. Further, in the present embodiment, the determining step of determining the voltage drop value ΔV per unit time based on the first open-circuit voltage OCV1 and the second open-circuit voltage OCV2 corresponds to an example of the second determining step.

In the inspecting step, the third measuring step and the first determining step in steps S32 to S34 are performed when the opposing capacity ratio of the positive electrode capacity to the negative electrode capacity is within a predetermined allowable range. Further, the second measuring step and the second determining step in steps S23 to S25 are performed when the first determining step determines that the lithium-ion rechargeable battery 10 is not normal.

Figure 10:
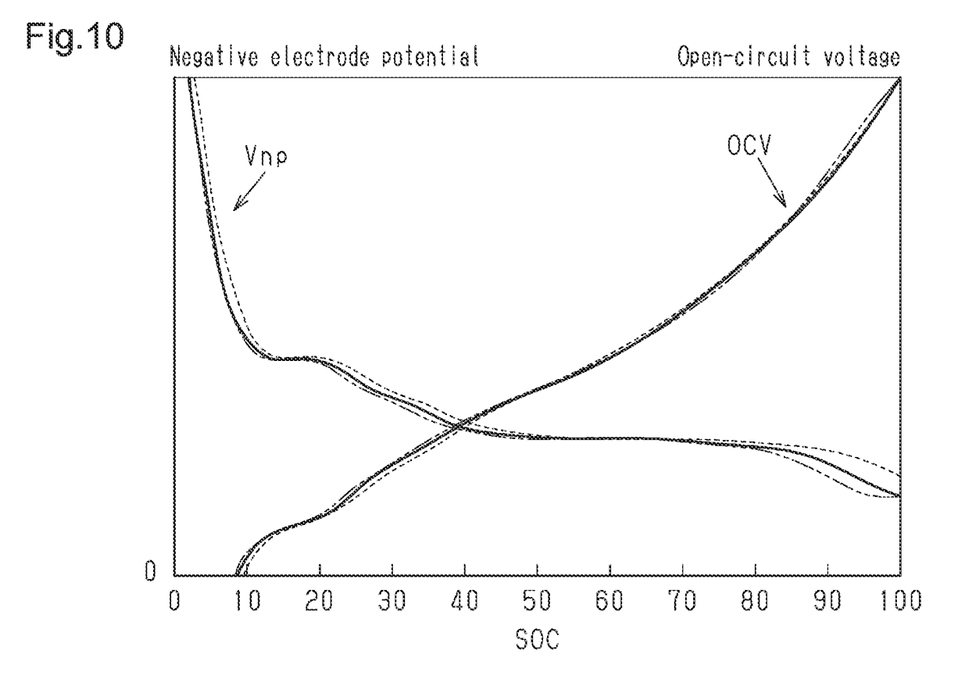
FIG. 10 is a graph showing the SOC, the open-circuit voltage, a negative electrode potential, and an opposing capacity ratio of the lithium-ion rechargeable battery of the second embodiment.
Figure 11:
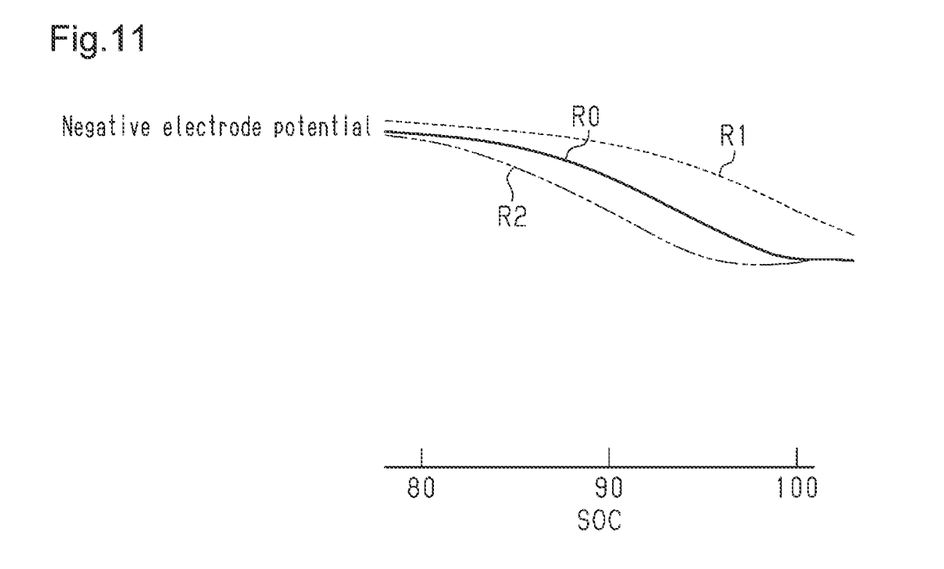
FIG. 11 is a graph showing the SOC, the negative electrode potential, and the opposing capacity ratio of the lithium-ion rechargeable battery of the second embodiment.
Figure 12:
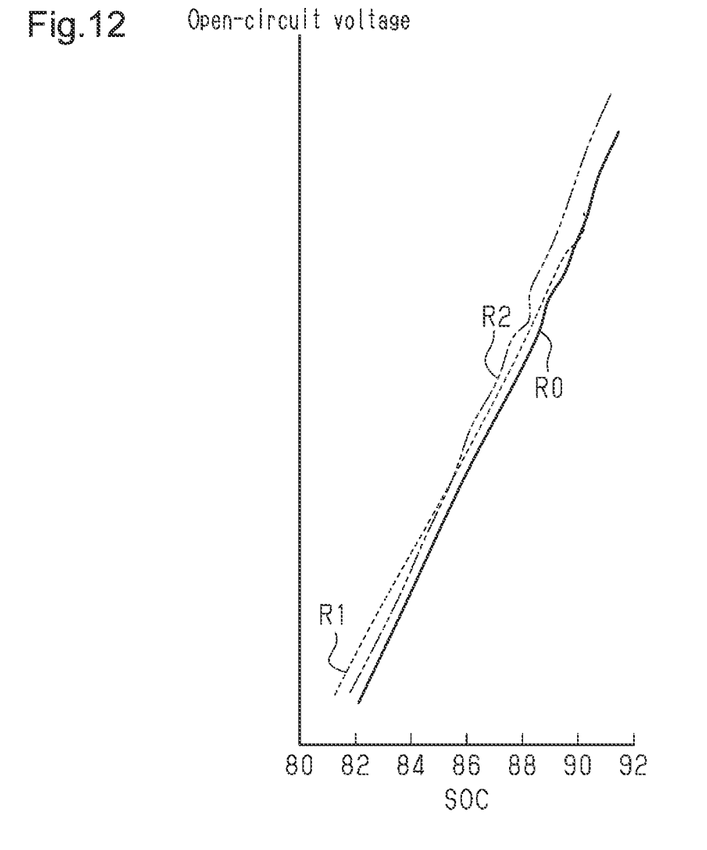
FIG. 12 is a graph showing the SOC, the open-circuit voltage, and the opposing capacity ratio of the lithium-ion rechargeable battery of the second embodiment.

SOC, Opposing Capacity Ratio, Open-Circuit Voltage OCV, and Negative Electrode Potential Vnp The relationship between the SOC, the opposing capacity ratio, the open-circuit voltage OCV, and the negative electrode potential Vnp will now be described with reference to FIGS. 10 to 13. In FIGS. 10 to 12, the open-circuit voltage OCV and the negative electrode potential Vnp obtained when the opposing capacity ratio is the reference opposing capacity ratio R0 are shown by solid lines. In FIGS. 10 to 12, the open-circuit voltage OCV and the negative electrode potential Vnp obtained when the opposing capacity ratio is a first opposing capacity ratio R1 are shown by broken lines. In FIGS. 10 to 12, the open-circuit voltage OCV and the negative electrode potential Vnp obtained when the opposing capacity ratio is a second opposing capacity ratio R2 are shown by long dashed double-short dashed lines.

As shown in FIG. 10, as the SOC decreases, the open-circuit voltage OCV of the lithium-ion rechargeable battery 10 decreases. As the SOC increases, the open-circuit voltage OCV of the lithium-ion rechargeable battery 10 increases. As the SOC decreases, the negative electrode potential Vnp of the lithium-ion rechargeable battery 10 increases. As the SOC increases, the negative electrode potential Vnp of the lithium-ion rechargeable battery 10 decreases.

In particular, as shown in FIG. 11, when the SOC ranges from 80% to 90%, which are possible percentages in the self-discharging inspection, the negative electrode potential Vnp varies depending on the opposing capacity ratio. Specifically, when the SOC ranges from 80% to 90%, which are possible percentages in the self-discharging inspection, the negative electrode potential Vnp decreases more rapidly when the opposing capacity ratio is the reference opposing capacity ratio R0 than when the opposing capacity ratio is the first opposing capacity ratio R1. When the SOC ranges from 80% to 90%, which are possible percentages in the self-discharging inspection, the negative electrode potential Vnp decreases more rapidly when the opposing capacity ratio is the second opposing capacity ratio R2 than when the opposing capacity ratio is the reference opposing capacity ratio R0.

As shown in FIG. 12, when the SOC ranges from 80% to 90%, which are possible percentages in the self-discharging inspection, the voltage drop value ΔV of the open-circuit voltage OCV per SOC differs depending on the opposing capacity ratio. This is because, when the SOC ranges from 80% to 90%, which are possible percentages in the self-discharging inspection, the negative electrode potential Vnp varies in correspondence with the opposing capacity ratio.

Figure 13:
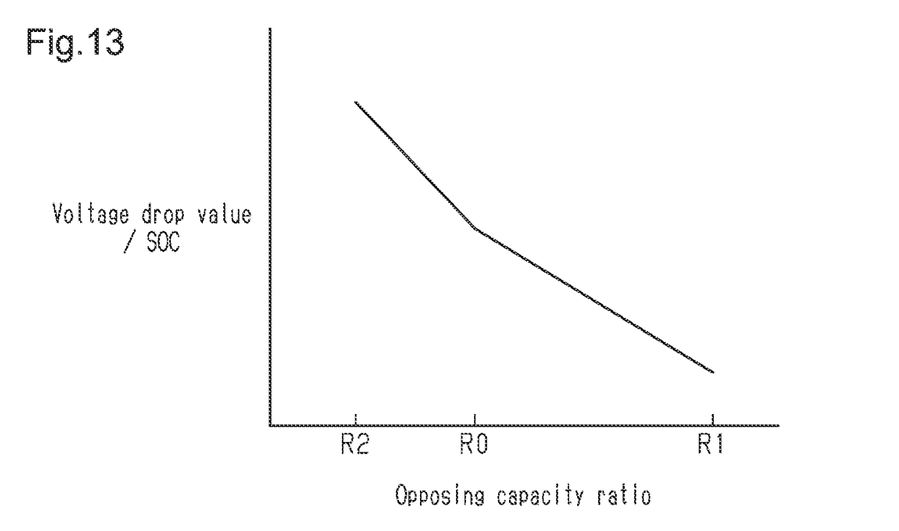
FIG. 13 is a graph showing the voltage drop value and the opposing capacity ratio per change in the SOC in the lithium-ion rechargeable battery of the second embodiment.

Specifically, as shown in FIGS. 12 and 13, when the SOC ranges from 80% to 90%, which are possible percentages in the self-discharging inspection, the voltage drop value ΔV of the open-circuit voltage OCV per SOC is smaller when the opposing capacity ratio is the first opposing capacity ratio R1 than when the opposing capacity ratio is the reference opposing capacity ratio R0. When the SOC ranges from 80% to 90%, which are possible percentages in the self-discharging inspection, the voltage drop value ΔV of the open-circuit voltage OCV per SOC is larger when the opposing capacity ratio is the second opposing capacity ratio R2 than when the opposing capacity ratio is the reference opposing capacity ratio R0.

Thus, the third measuring step and the first determining step in steps S32 to S34 are performed in step S31 on the condition that the opposing capacity ratio is within the allowable range. The allowable range is set with reference to the reference opposing capacity ratio R0. Instead, the allowable range may be a range that does not include the first opposing capacity ratio R1 or the second opposing capacity ratio R2.

Operation of Second Embodiment

The operation of the second embodiment will now be described.

In a case where the opposing capacity ratio is within the allowable range, the third open-circuit voltage OCV3 is measured in the second period P2 after the short time, which is shorter than the specified time, has elapsed since the first open-circuit voltage OCV1 was measured. The voltage drop value ΔV per unit time of the open-circuit voltage OCV is calculated based on the first open-circuit voltage OCV1, the third open-circuit voltage OCV3, and the short time. When the calculated voltage drop value ΔV per unit time of the open-circuit voltage OCV is determined as being less than or equal to the threshold value, a self-discharging inspection determines that each lithium-ion rechargeable battery 10 is normal. Even when it is determined that the calculated voltage drop value ΔV per unit time is not less than or equal to the threshold value, a determination based on the second open-circuit voltage OCV2 is performed again.

Thus, even before the specified time has elapsed after the first open-circuit voltage OCV1 was measured, the voltage drop value ΔV per unit time can be determined based on the third open-circuit voltage OCV3. This shortens the inspection time of the self-discharging inspection. In particular, this is preferable when the opposing capacity ratio is within the allowable range.

Advantages of Second Embodiment

The advantages of the second embodiment will now be described.

(3) In the method for inspecting the lithium-ion rechargeable battery 10 of the present embodiment, the third open-circuit voltage OCV3 is used to determine whether the lithium-ion rechargeable battery 10 is normal even before the measurement of the second open-circuit voltage OCV2. This further shortens the inspection time of the self-discharging inspection.

(4) In particular, the third open-circuit voltage OCV3 is used to determine whether the lithium-ion rechargeable battery 10 is normal when the opposing capacity ratio is within the predetermined allowable range. This limits the variations in the voltage drop value ΔV per unit time. Thus, as the inspection time of the self-discharging inspection becomes shorter, the inspection accuracy increases.

Modified Examples

The above embodiments may be modified as follows. The above embodiments and the following modifications can be combined as long as they remain technically consistent with each other.

In the second embodiment, in the manufacturing condition of the lithium-ion rechargeable battery 10, for example, the parameters used to calculate the positive electrode capacity may include another parameter such as the thickness of the electrode body 15 rolled in the rolling step. For example, the positive base 31, the positive composite material layer 32, the negative base 21, and the negative composite material layer 22 preferably have the same material properties. Thus, the variations in the opposing capacity ratio of the lithium-ion rechargeable battery 10 are limited by limiting variations in the parameters that affect the positive electrode capacity of the lithium-ion rechargeable battery 10. Likewise, the variations in the opposing capacity ratio of the lithium-ion rechargeable battery 10 are limited by limiting variations in the parameters that affect the negative electrode capacity of the lithium-ion rechargeable battery 10.

In the second embodiment, for example, the allowable range of the opposing capacity ratio of the lithium-ion rechargeable battery 10 may include the first opposing capacity ratio R1 and the second opposing capacity ratio R2. Alternatively, for example, the allowable range of the opposing capacity ratio of the lithium-ion rechargeable battery 10 may be set to any range with reference to the reference opposing capacity ratio R0. In such a case, the threshold value of the voltage drop value ΔV per unit time may be set to be relatively large.

In the second embodiment, for example, the threshold value of the voltage drop value ΔV per unit time may be set in correspondence with the reference opposing capacity ratio R0 of the lithium-ion rechargeable battery 10.

In the second embodiment, for example, the threshold value used for the determination based on the first open-circuit voltage OCV1 and the second open-circuit voltage OCV2 may be different from that used for the determination based on the first open-circuit voltage OCV1 and the third open-circuit voltage OCV3. That is, the voltage drop value ΔV per unit time based on the first open-circuit voltage OCV1 and the second open-circuit voltage OCV2 may be set to a first threshold value, and the voltage drop value ΔV per unit time based on the first open-circuit voltage OCV1 and the third open-circuit voltage OCV3 may be set to a second threshold value. For example, the second threshold value may be smaller than the first threshold value. Thus, the determination based on the first open-circuit voltage OCV1 and the third open-circuit voltage OCV3 is performed based on stricter criteria.

In the present embodiment, for example, the length of the first period P1 may be changed according to the time in the high-temperature aging step. For example, the length of the first period P1 may be changed according to the temperature in the high-temperature aging step. For example, the length of the first period P1 may be changed according to the time of the cooling step. For example, the length of the first period P1 may be changed according to the amount of cold air in the cooling step. For example, the length of the first period P1 may be changed according to the number of lithium-ion rechargeable batteries 10 subject to inspection. For example, the length of the first period P1 may be changed according to the arrangement of lithium-ion rechargeable batteries 10 subject to inspection.

In the present embodiment, the first, second, and third measuring steps are performed when the SOC of the lithium-ion rechargeable battery 10 ranges from 80% to 90%. Instead, the first, second, and third measuring steps may be performed when the SOC of the lithium-ion rechargeable battery 10 ranges from 80% to 90% or when the SOC of the lithium-ion rechargeable battery 10 ranges from 90% to 100%.

The flowcharts shown in FIGS. 5 and 9 are merely examples. One skilled in the art may add, remove, change, and reorder the steps in the flowcharts and execute the steps.

In the present embodiment, the lithium-ion rechargeable battery 10 is used an example to describe the present disclosure. Instead, the lithium-ion rechargeable battery 10 may be applied to another type of nonaqueous electrolyte rechargeable battery.

In the present embodiment, the lithium-ion rechargeable battery 10 is of a vehicle on-board type and has a thin-plate shape. Instead, the lithium-ion rechargeable battery 10 may be a columnar battery. The lithium-ion rechargeable battery 10 is not limited to one for vehicle on-board use and may be used for a ship, an aircraft, or a stationary battery.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A method for inspecting a nonaqueous electrolyte rechargeable battery that includes an electrode body, a nonaqueous electrolyte, and a battery case accommodating the electrode body and the nonaqueous electrolyte, the method comprising:
   a high-temperature aging step of storing, under a high-temperature environment, the nonaqueous electrolyte rechargeable battery after being charged;
   a cooling step of cooling the nonaqueous electrolyte rechargeable battery stored under the high-temperature environment in the high-temperature aging step; and
   an inspecting step of inspecting, upon completion of the cooling step, whether the nonaqueous electrolyte rechargeable battery is normal based on a voltage drop value per unit time in the nonaqueous electrolyte rechargeable battery, wherein
   the inspecting step includes a first period after the cooling step ends and a second period after the first period ends,
   variations in the voltage drop value per unit time in the nonaqueous electrolyte rechargeable battery are smaller in the second period than in the first period,
   the inspecting step inspects whether the nonaqueous electrolyte rechargeable battery is normal in a state where the electrode body is directly or indirectly pressurized and restrained in a thickness direction, the cooling step cools the nonaqueous electrolyte rechargeable battery in a state where the electrode body is directly or indirectly pressurized and restrained in the thickness direction with a smaller pressure than a pressure in the inspecting step or in a state where the electrode body is not restrained, and the inspecting step includes:
- a first measuring step of measuring a voltage value of the nonaqueous electrolyte rechargeable battery in the second period;
- a third measuring step of measuring, in the second period, the voltage value of the nonaqueous electrolyte rechargeable battery when a time shorter than a specified time has passed after the first measuring step was performed;

a first determining step of determining that the nonaqueous electrolyte rechargeable battery is normal when the voltage drop value per unit time based on the voltage value measured in the first measuring step and the voltage value measured in the third measuring step is less than or equal to a threshold value;

a second measuring step of measuring, in the second period, in a case where the first determining step determines that the nonaqueous electrolyte rechargeable battery is not normal, the voltage value of the nonaqueous electrolyte rechargeable battery when the specified time has passed after the first measuring step was performed; and a second determining step of determining that the nonaqueous electrolyte rechargeable battery is normal when the voltage drop value per unit time based on the voltage value measured in the first measuring step and the voltage value measured in the second measuring step is less than or equal to fall the threshold value.

2. The method according to claim 1, wherein the electrode body includes a positive electrode, a negative electrode, and a separator, the electrode body is formed by laminating the positive electrode and the negative electrode with the separator disposed between the positive electrode and the negative electrode, and in the inspecting step, the third measuring step and the first determining step are performed when an opposing capacity ratio of the positive electrode to the negative electrode is within a predetermined allowable range.

3. The method according to claim 1, wherein the first measuring step and the second measuring step are performed when a state of charge (SOC) of the nonaqueous electrolyte rechargeable battery is 80% to 90%.

4. A method for inspecting a nonaqueous electrolyte rechargeable battery that includes an electrode body, a nonaqueous electrolyte, and a battery case accommodating the electrode body and the nonaqueous electrolyte, the method comprising:
- a high-temperature aging step of storing, under a high-temperature environment, the nonaqueous electrolyte rechargeable battery after being charged;
- a cooling step of cooling the nonaqueous electrolyte rechargeable battery stored under the high-temperature environment in the high-temperature aging step; and
- an inspecting step of inspecting, upon completion of the cooling step, whether the nonaqueous electrolyte rechargeable battery is normal based on a voltage drop value per unit time in the nonaqueous electrolyte rechargeable battery, wherein the inspecting step includes a first period after the cooling step ends and a second period after the first period ends, variations in the voltage drop value per unit time in the nonaqueous electrolyte rechargeable battery are smaller in the second period than in the first period, the inspecting step includes:
- a first measuring step of measuring a voltage value of the nonaqueous electrolyte rechargeable battery in the second period;
- a third measuring step of measuring, in the second period, the voltage value of the nonaqueous electrolyte rechargeable battery when a time shorter than a specified time has passed after the first measuring step was performed;
- a first determining step of determining that the nonaqueous electrolyte rechargeable battery is normal when the voltage drop value per unit time based on the voltage value measured in the first measuring step and the voltage value measured in the third measuring step is less than or equal to a threshold value;
- a second measuring step of measuring, in a case where the first determining step determines that the nonaqueous electrolyte rechargeable battery is not normal, the voltage value of the nonaqueous electrolyte rechargeable battery when the specified time has passed after the first measuring step was performed; and
- a second determining step of determining that the nonaqueous electrolyte rechargeable battery is normal when the voltage drop value per unit time based on the voltage value measured in the first measuring step and the voltage value measured in the second measuring step is less than or equal to the threshold value.

* * * * *

UNITED STATES PATENT AND TRADEMARK OFFICE
CERTIFICATE OF CORRECTION

PATENT NO. : 12,265,133 B2
APPLICATION NO. : 18/072563
DATED : April 1, 2025
INVENTOR(S) : Shusaku Goto et al.

It is certified that error appears in the above-identified patent and that said Letters Patent is hereby corrected as shown below:

On the Title Page

In Item (72) under "Inventor", in Column 1, delete "Tokyo (JP)" and insert -- Toyota (JP) -- therefor.

Signed and Sealed this
Twenty-seventh Day of May, 2025

Coke Morgan Stewart
*Acting Director of the United States Patent and Trademark Office*